(12) United States Patent
Bhalla et al.

(10) Patent No.: US 8,507,978 B2
(45) Date of Patent: Aug. 13, 2013

(54) SPLIT-GATE STRUCTURE IN TRENCH-BASED SILICON CARBIDE POWER DEVICE

(75) Inventors: Anup Bhalla, Santa Clara, CA (US); Madhur Bobde, Sunnyvale, CA (US); Lingpeng Guan, San Jose, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 102 days.

(21) Appl. No.: 13/162,407

(22) Filed: Jun. 16, 2011

(65) Prior Publication Data
US 2012/0319132 A1   Dec. 20, 2012

(51) Int. Cl.
*H01L 29/66*   (2006.01)

(52) U.S. Cl.
USPC ...... 257/330; 257/77; 257/328; 257/E21.351; 257/E21.419; 438/270; 438/259; 438/591; 438/931

(58) Field of Classification Search
USPC .................................................. 257/E21.419
See application file for complete search history.

(56) References Cited

U.S. PATENT DOCUMENTS

| | | | |
|---|---|---|---|
| 6,509,233 B2 | 1/2003 | Chang | |
| 7,285,822 B2 | 10/2007 | Bhalla | |
| 7,436,022 B2 | 10/2008 | Bhalla | |
| 7,453,119 B2 | 11/2008 | Bhalla | |
| 7,521,332 B2 | 4/2009 | Li et al. | |
| 7,605,425 B2 | 10/2009 | Bhalla | |
| 7,750,447 B2 | 7/2010 | Chang | |
| 7,767,526 B1 | 8/2010 | Lee | |
| 7,795,108 B2 | 9/2010 | Li | |
| 7,799,646 B2 | 9/2010 | Su | |
| 7,829,947 B2 | 11/2010 | Hebert | |
| 7,851,856 B2 | 12/2010 | Hebert | |
| 7,863,675 B2 | 1/2011 | Bhalla | |
| 7,867,852 B2 | 1/2011 | Hebert | |
| 7,875,541 B2 | 1/2011 | Tai | |
| 7,879,676 B2 | 2/2011 | Lee | |
| 7,923,774 B2 | 4/2011 | Bhalla | |
| 7,936,011 B2 | 5/2011 | Bhalla | |
| 7,939,882 B2 | 5/2011 | Su | |
| 2004/0089910 A1* | 5/2004 | Hirler et al. | 257/500 |
| 2008/0246082 A1* | 10/2008 | Hshieh | 257/333 |

(Continued)

OTHER PUBLICATIONS

John Chen et al., U.S. Appl. No. 12/643,837, filed Dec. 21, 2009.

(Continued)

*Primary Examiner* — Marcos D. Pizarro
*Assistant Examiner* — Cesar Lopez
(74) *Attorney, Agent, or Firm* — Joshua D. Isenberg; JDI Patent

(57) ABSTRACT

An integrated structure includes a plurality of split-gate trench MOSFETs. A plurality of trenches is formed within the silicon carbide substrate composition, each trench is lined with a passivation layer, each trench being substantially filled with a first conductive region a second conductive region and an insulating material having a dielectric constant similar to a dielectric constant of the silicon carbide substrate composition. The first conductive region is separated from the passivation layer by the insulating material. The first and second conductive regions form gate regions for each trench MOSFET. The first conductive region is separated from the second conductive region by the passivation layer. A doped body region of a first conductivity type formed at an upper portion of the substrate composition and a doped source region of a second conductivity type formed inside the doped body region.

19 Claims, 4 Drawing Sheets

(56) References Cited

U.S. PATENT DOCUMENTS

| | | |
|---|---|---|
| 2008/0265289 A1 | 10/2008 | Bhalla |
| 2008/0265312 A1 | 10/2008 | Bhalla |
| 2009/0039456 A1 | 2/2009 | Bhalla |
| 2009/0114949 A1 | 5/2009 | Hebert |
| 2009/0127593 A1 | 5/2009 | Bhalla |
| 2009/0181503 A1 | 7/2009 | Bhalla |
| 2009/0242973 A1 | 10/2009 | Hebert et al. |
| 2010/0148246 A1 | 6/2010 | Bhalla |
| 2010/0155876 A1 | 6/2010 | Pan |
| 2010/0225296 A1 | 9/2010 | Chang et al. |
| 2010/0258897 A1 | 10/2010 | Lui |
| 2010/0314693 A1 | 12/2010 | Su et al. |
| 2010/0330767 A1 | 12/2010 | Lui |
| 2011/0014766 A1 | 1/2011 | Hebert |
| 2011/0037120 A1 | 2/2011 | Chen |
| 2011/0039383 A1 | 2/2011 | Chen |
| 2011/0042724 A1 | 2/2011 | Bhalla |
| 2011/0042727 A1 | 2/2011 | Pan |
| 2011/0042742 A1 | 2/2011 | Bhalla |
| 2011/0049564 A1 | 3/2011 | Guan |
| 2011/0049618 A1* | 3/2011 | Lee et al. ............ 257/330 |
| 2011/0068386 A1 | 3/2011 | Tai et al. |
| 2011/0068395 A1 | 3/2011 | Hebert |
| 2011/0073906 A1 | 3/2011 | Bobde |
| 2011/0073943 A1 | 3/2011 | Hebert |
| 2011/0076815 A1 | 3/2011 | Bhalla |
| 2011/0095361 A1 | 4/2011 | Chang et al. |
| 2011/0101446 A1 | 5/2011 | Guan et al. |

OTHER PUBLICATIONS

Hong Chang et al., U.S. Appl. No. 12/722,384, filed Mar. 11, 2010.
Sik Lui et al., U.S. Appl. No. 12/731,112, filed Mar. 24, 2010.
Sung-Shan Tai et al., U.S. Appl. No. 12/782,573, filed May 18, 2010.
Sik Lui et al. U.S. Appl. No. 12/968,179, filed Dec. 14, 2010.
Hong Chang et al., U.S. Appl. No. 13/010,427, filed Jan. 20, 2011.
Sik Lui et al., U.S. Appl. No. 13/079,675, filed Apr. 4, 2011.
Yeeheng Lee, U.S. Appl. No. 12/826,591, filed Jun. 29, 2010.

* cited by examiner

US 8,507,978 B2

SPLIT-GATE STRUCTURE IN TRENCH-BASED SILICON CARBIDE POWER DEVICE

FIELD OF INVENTION

Embodiments of the present invention are related to power integrated circuits and more specifically to an integrated structure that includes split-gate trench MOSFETs in a silicon carbide substrate.

BACKGROUND

The majority of semiconductor power devices are fabricated using silicon as a substrate. Recently, a trend has developed towards fabricating power devices using silicon carbide (SiC), specifically for high voltage power devices. Silicon carbide exhibits several desirable characteristics compared with silicon including the ability to operate at a high temperature, high power level, and high frequency. Additionally, silicon carbide power devices exhibit low specific on-resistance ($R_{DSon}$) and high thermal conductivity, specifically 500 to 1000 times higher than silicon power devices, making it desirable for use in constructing power devices.

While silicon carbide does display these desirable characteristics, it also exhibits several non-ideal characteristics that make fabrication of trench-based power devices using silicon carbide rather difficult. The main issue associated with trench-based power device fabrication using silicon carbide is the large electric field stress imposed on the oxide lining the trench during device operation. Because the critical field for breakdown in silicon carbide is so high, it causes a large field to exist in the oxide lining the trench during operation. This high electric field stress will lead to catastrophic breakdown of the oxide. Several techniques exist for reducing this field stress, but these techniques either degrade the on-resistance of the device, or are impractical to implement during fabrication.

It is within this context that embodiments of the present invention arise.

DESCRIPTION OF THE SPECIFIC EMBODIMENTS

Introduction

Figure 1A:
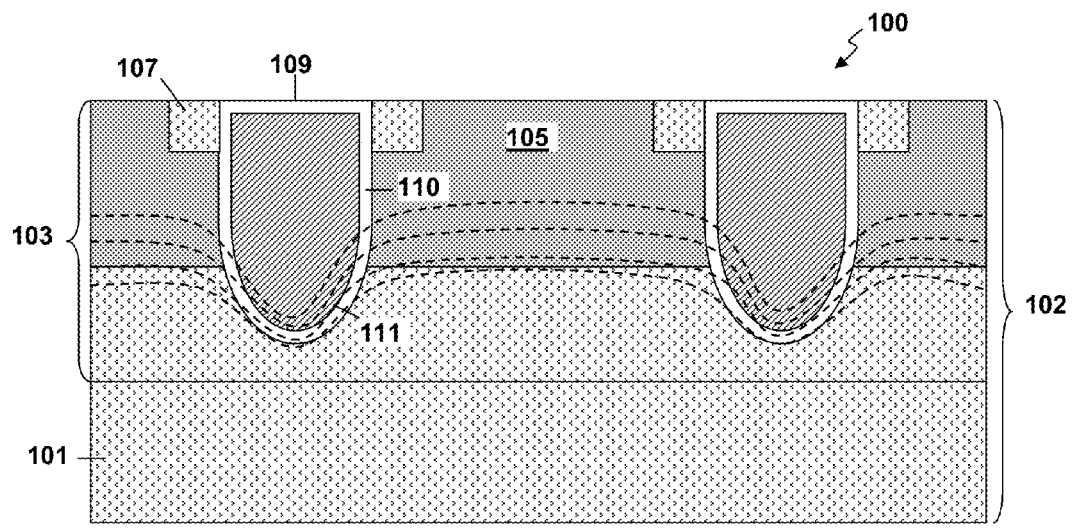
FIG. 1A is a schematic cross-sectional diagram of a non-operational silicon carbide trench MOSFET integrated structure.
Figure 1B:
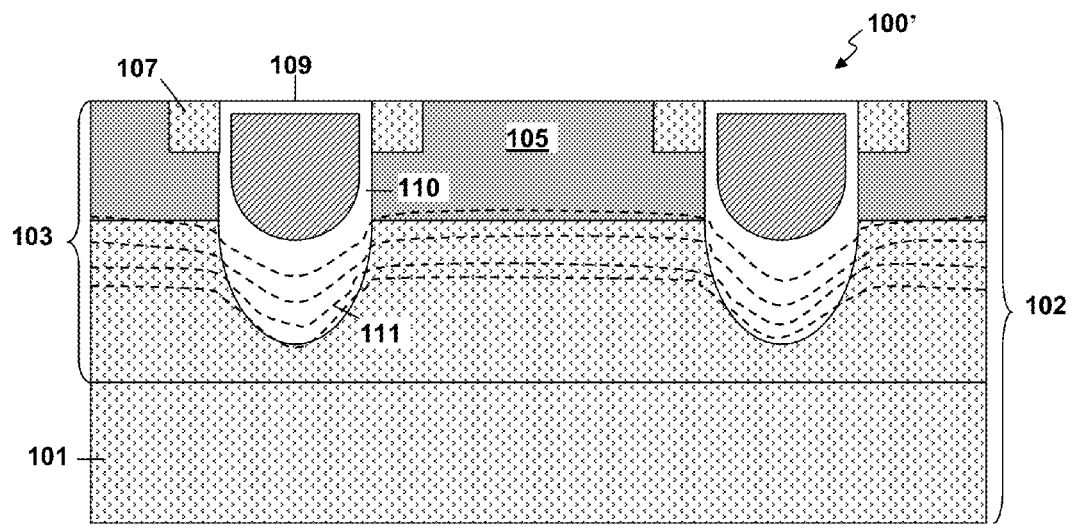
FIG. 1B is a schematic cross-sectional diagram of an alternative non-operational silicon carbide trench MOSFET integrated structure.
Figure 1C:
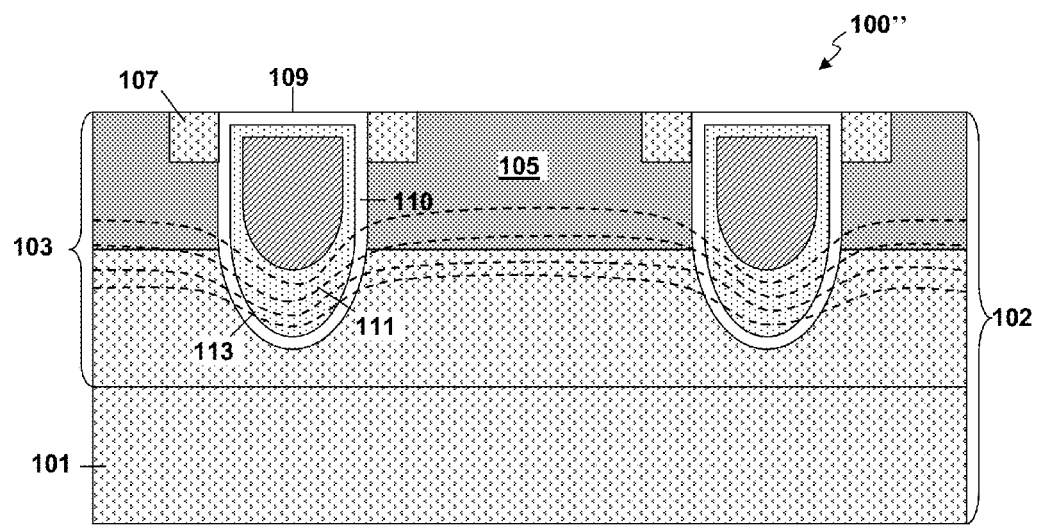
FIG. 1C is a schematic cross-sectional diagram of an alternative non-operational silicon carbide trench MOSFET integrated structure.
Figure 1D:
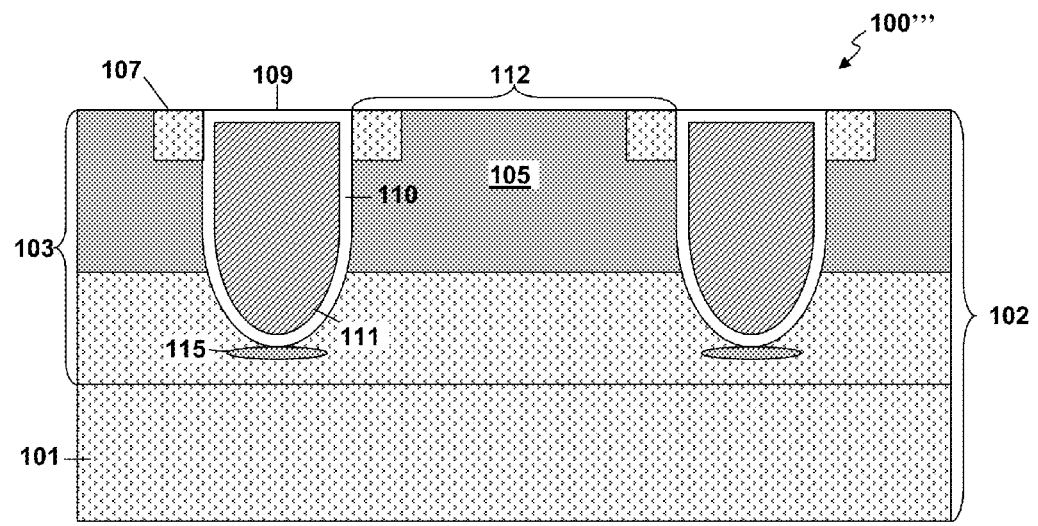
FIG. 1D is a schematic cross-sectional diagram of an alternative non-operational silicon carbide trench MOSFET integrated structure.

Problems with silicon carbide trench MOSFET technology can be understood by referring to FIG. 1A through FIG. 1D. FIG. 1A depicts a non-operational silicon carbide trench MOSFET integrated structure that mimics prior art silicon based trench MOSFET integrated structures by substituting a silicon carbide substrate for a conventional silicon substrate. FIGS. 1B-1D depict non-operational silicon carbide trench MOSFET integrated structures that attempt to rectify issues associated with silicon carbide integrated structures using several popular techniques, but fail to adequately do so.

FIG. 1A is a schematic cross-sectional diagram of a non-operational silicon carbide trench MOSFET integrated structure 100. It is important to note that this integrated structure 100 fails to exhibit optimal behavioral characteristics, and is depicted in order to illustrate issues that arise when attempting to fabricate a silicon carbide trench MOSFET device. The silicon carbide trench MOSFET integrated structure 100 is configured in a similar manner to prior art silicon trench MOSFET integrated devices that use a silicon substrate.

The silicon carbide trench MOSFET integrated structure 100 is fabricated using a silicon carbide substrate composition 102. As illustrated, this silicon carbide substrate composition 102 is composed of a heavily doped silicon carbide substrate 101 covered with a lightly doped epitaxial layer 103 of silicon carbide grown, deposited or otherwise formed on a surface of the substrate 101. Alternatively, silicon carbide substrate composition 102 may be composed of only the silicon carbide substrate 101. The silicon carbide substrate 101 forms the drain region of each MOSFET device in the integrated structure 100. A plurality of trenches 109 are formed within the silicon carbide substrate composition 102 (i.e., silicon carbide substrate 101 and epitaxial layer 103). Each trench is aligned with an insulating layer 110 and filled with conductive material 111. The insulating layer 110 may be silicon oxide ($SiO_2$). The conductive material 111 forms the gate region of each MOSFET device in the integrated structure 100.

A body region 105 of a first conductivity type is formed in an upper portion of the epitaxial layer 103. The body region 105 is doped such that is has an opposite conductivity type to that of the substrate composition 102. By way of example, and not by way of limitation, the body region 105 may be p-type for an n-type silicon carbide substrate composition 102. A source region 107 of a second conductivity type is formed within the body region 105. By way of example, and not by way of limitation, the source region 107 may be n+ type for an n-type silicon carbide substrate composition and p-type body region. The notation n+ type means that it is doped with a higher concentration of dopants than the n-type substrate composition 102. The body region 105 forms a channel allowing current flow from the source region 107 to the drain region when the MOSFET operates in the on-state.

While this trench MOSFET integrated structure 100 configuration exhibits favorable behavioral characteristics when implemented using a silicon substrate composition (i.e., silicon substrate+epitaxial layer or silicon substrate), it exhibits many non-ideal behavioral characteristics when implemented using a silicon carbide substrate composition 102. Because silicon carbide supports a high critical electrical field for breakdown, it causes a large field to exist in the insulating layer 110 during device operation, as indicated by the closeness of the dashed equipotential lines. This phenomenon happens when the device is in the blocking mode and supports high voltage between the drain and the source electrode. The peak electric field at the bottom of the trench 109 can be 2.5 times greater in magnitude than the electric field in the silicon carbide substrate 101. Moreover, the peak electric field at the corners of each trench 109 may be significantly greater due to two-dimensional field effects. These high peak electric fields will induce major field stress on the insulating layer (e.g. silicon oxide), leading to catastrophic breakdown. As such, a silicon carbide trench MOSFET integrated structure 100 configured in accordance with FIG. 1A will fail to perform desirably.

One way to reduce the field stress in the insulator 110 is to increase the thickness of the insulator, particularly making the insulator thicker between the bottom of the gate electrode and the bottom of the trench. Although this reduces the field strength the field is highly non-uniform, particularly near the trench walls, due to the difference in dielectric constant between silicon dioxide and the nearby silicon carbide. FIG. 1B is a schematic cross-sectional diagram of an alternative non-operational silicon carbide trench MOSFET integrated structure 100' in which a gate is insulated by a thicker insulator 110 at the bottom of the trench. Again, it is important to note that this integrated structure 100' fails to exhibit optimal behavioral characteristics, and is depicted in order to illustrate issues that arise when attempting to fabricate a silicon carbide trench MOSFET device. Specifically, although the electric field strength at the bottom of the trench is reduced there is significant electric field at the sides of the trench due to the mismatch in dielectric constant between the insulator 110 (typically silicon dioxide) and the silicon carbide substrate 101.

Another way to reduce field stress on an insulating layer of a trench MOSFET integrated structure is to make the dielectric constant of the gate insulator material similar to the dielectric constant of the silicon carbide substrate. As used herein a first dielectric constant is "similar to" second dielectric constant if the first dielectric constant is within 50% (i.e., between 50% and 150%) of the second dielectric constant. Specifically, the silicon carbide trench MOSFET integrated structure in FIG. 1B can be further modified as shown in FIG. 1C by introducing an insulating layer 113 with dielectric properties that closely match those of the silicon carbide substrate 101. By way of example, and not by way of limitation, the insulating layer 113 may be composed of silicon nitride ($Si_3N_4$) or hafnium oxide ($HfO_2$). Silicon nitride exhibits a dielectric constant of 7.5 and hafnium oxide exhibits a dielectric constant of 25, both of which closely match silicon carbide's dielectric constant of 9.72. A thin layer of silicon dioxide 110 lines the trench 109, functioning as a passivation layer, to prevent further corrosion of the trench walls. The similar dielectric constants and thicker insulating material reduces the field stress and field non-uniformity, as can be seen by the dashed equipotentials.

While this particular trench MOSFET integrated structure 100" does significantly relieve oxide field stress related to the mismatching of dielectric materials discussed above, it still exhibits non-ideal behavioral characteristics that render its real-world implementation rather difficult. Specifically, this configuration leads to the formation of a large coupling capacitance between the gate and drain during operation, which must be discharged during switching. However, because coupling capacitance formed between the gate and drain is particularly large, the rate of discharge proceeds at a very slow rate, which leads to ineffective device operation due to slow switching speed. Such an integrated structure 100" fails to exhibit the properties necessary to operate effectively as a silicon carbide trench MOSFET integrated structure.

An alternative method for relieving oxide field stress at the trench-silicon carbide substrate composition interface involves performing a p-type implantation at the trench bottom. FIG. 1D is a schematic cross-sectional diagram of another alternative non-operational silicon carbide trench MOSFET integrated structure where p-type implantation has been performed at the trench bottom. Again, it is important to note that this integrated structure 100''' fails to exhibit optimal behavioral characteristics, and is depicted in order to illustrate issues that arise when attempting to fabricate a silicon carbide trench MOSFET device.

The silicon carbide trench MOSFET integrated structure 100''' in FIG. 1D modifies the silicon carbide trench MOSFET device 100 of FIG. 1A by introducing a p-type implant 115 at the bottom of each trench 109. A p-type implant 115, such as the one illustrated, effectively reduces the insulating layer field stress at the trench-silicon carbide substrate composition 102 interface by shielding the insulating layer from a portion of the electric field. The process for implementing a p-type implant 115 involves a high-energy dopant implantation followed by activation of the dopants at an elevated temperature.

Although dopant implantation is a relatively common procedure in silicon-based trench MOSFET fabrication, it is rather difficult to implement with a silicon carbide substrate composition 102. During silicon carbide-based trench MOSFET fabrication, dopant implant activation requires a temperature of 1600° C. Such a high activation temperature is very difficult to achieve, and as such p-type dopant implantation is impractical for reducing insulating layer field stress in a silicon carbide-based trench MOSFET. Other techniques for reducing insulating layer field stress must be used when dealing with a silicon carbide-based trench MOSFET.

Figure 2:
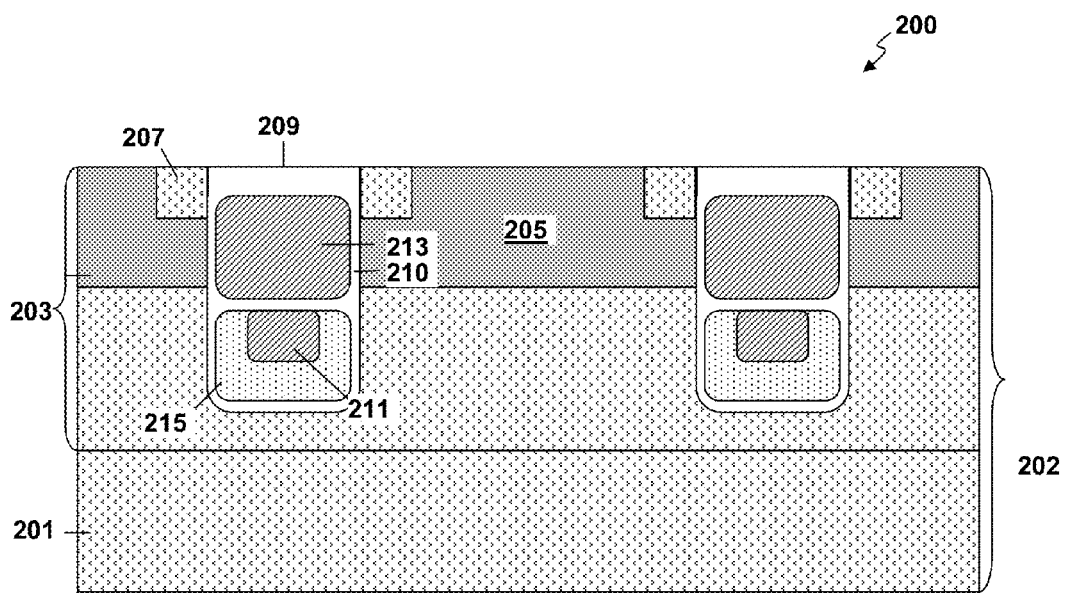
FIG. 2 is a schematic diagram illustrating a silicon-carbide trench MOSFET integrated structure in accordance with an embodiment of the present invention.

FIG. 2 is a schematic diagram illustrating a silicon-carbide trench MOSFET integrated structure in accordance with an embodiment of the present invention. The silicon-carbide trench MOSFET integrated structure 200 in FIG. 2 resolves the issues associated with the non-operational silicon carbide trench MOSFET integrated structures illustrated in FIGS. 1A-1D.

The silicon carbide trench MOSFET integrated structure 200 is fabricated using a silicon carbide substrate composition 202. As illustrated, this silicon carbide substrate composition 202 is composed of a silicon carbide substrate 201 covered with an epitaxial layer 203. Alternatively, this silicon carbide substrate composition 202 may be composed of only the silicon carbide substrate 201. The silicon carbide substrate 201 forms the drain region of each MOSFET device. A plurality of trenches 209 are formed within the silicon carbide substrate composition (i.e., silicon carbide substrate 201 and epitaxial layer 203).

Each trench is initially lined with a thin passivation layer 210. A relatively thick insulating material 215 is then formed on the passivation layer and a first conductive region (i.e., bottom gate region) 211 is formed with the thick insulating material 215 between the first conductive region 211 and the passivation layer 210. A second conductive region (i.e., top gate region) 213 is also formed within the trench 209 above the first conductive region 211 with a portion of the thin passivation layer 210 between the first conductive region 211 and the second conductive region 213. Hereinafter, the terms "first conductive region" and "bottom gate region" will be used interchangeably. Additionally, hereinafter, the terms "second conductive region" and "top gate region" will be used interchangeably. The second conductive region 213 is separated from the first conductive region 211 by the portion of the thin passivation layer 210 that lies between them. By way of example, and not by way of limitation, the passivation layer 210 may be silicon oxide. Also, by way of example, and not by way of limitation, the thick insulating layer 215 may be silicon nitride or hafnium oxide or any similar dielectric material having a dielectric constant similar to that of the silicon carbide substrate 201.

A portion of the insulating material 215 that lies between the first conductive region 211 and a bottom of the trench 209 can be made significantly thicker than a portion of the passivation layer 210 that is between the insulating material 215 and the bottom of the trench 209.

A body region 205 of a first conductivity type is formed in the epitaxial layer 203. By way of example, and not by way of limitation, the body region 205 may be p-type for an n-type silicon carbide substrate composition. A source region 207 of a second conductivity type is formed within parts of the body region 205 proximate the top gate region 213. By way of example, and not by way of limitation, the source region 207 may be n+ type for an n-type silicon carbide substrate composition and p-type body region. The body region 205 forms a channel allowing current flow from the source region 207 to the drain region when the MOSFET operates in the on-state.

While the fabrication steps have not been described in detail, one ordinarily skilled in the art will recognize that any number of commonly-used fabrication techniques may be used to configure such a silicon carbide trench MOSFET device.

The silicon-carbide trench MOSFET integrated structure 200 in FIG. 2 uses a split-gate configuration in contrast to the single-gate configuration used in FIGS. 1A-1D. The split-gate configuration reduces the large coupling capacitance between the gate region and drain region present in the device of FIG. 1C. The bottom gate region 211, which is normally held at source potential, shields the top gate region 213 from the drain (i.e., silicon carbide substrate) disposed below the trench bottom, which leads to a reduction in coupling capacitance between the gate region and drain region. This reduced coupling capacitance allows the device 200 to perform more effectively during switching operation.

Additionally, the split-gate configuration reduces insulating layer field stress near the bottom of the trench when the bottom gate region 211 is surrounded by a thick insulating layer. The thick insulating layer surrounding the bottom gate region 211 helps reduce the electric field built up at the bottom of the trench, and also at the corner of the trench, which in turn reduces the overall insulating layer field stress, leading to more effective device performance. Furthermore, the split-gate configuration facilitates lowering of device on-state resistance ($R_{DSon}$). This split-gate configuration can block a breakdown voltage of about 600V.

The silicon-carbide trench MOSFET integrated structure 200 in FIG. 2 also uses an insulating layer 215 that closely matches the dielectric properties of the silicon carbide substrate, in contrast to the silicon dioxide insulated device of FIGS. 1A, 1B and 1D. By using dielectric material with a dielectric constant that closely matches that of the silicon carbide substrate as the insulating layer, this silicon-carbide trench MOSFET device 200 is able to significantly reduce insulating layer field stress leading to favorable behavioral characteristics during device operation.

There are a number of ways in which to fabricate an integrated structure having a split gate (sometimes referred to as a shielded gate). Examples of such fabrication techniques are described, e.g., in U.S. Patent Application Publication number 20110068386 to Sung-Shan Tai et al, entitled "DIRECT CONTACT IN TRENCH WITH THREE-MASK SHIELD GATE PROCESS", published Mar. 24, 2011, the entire contents of which are incorporated herein by reference in their entirety. Another process for forming a split gate is described in U.S. patent application Ser. No. 11/373,024 to Anup Bhalla and Sik K. Lui filed Mar. 10, 2006 and issued as U.S. Pat. No. 7,453,119, the entire contents of both of which are incorporated herein by reference.

The silicon-carbide trench MOSFET integrated structure 200 in FIG. 2 avoids the need for a p-type dopant implant with the introduction of a closely-matched insulating layer. As a result, oxide field stress can be reduced without having to perform the difficult step of high-temperature dopant activation. Thus, this particular silicon-carbide trench MOSFET device achieves all the added benefits associated with fabricating a device using silicon carbide, while avoiding the potential issues of fabricating a device using silicon carbide depicted in FIG. 1A-1C.

Figure 3:
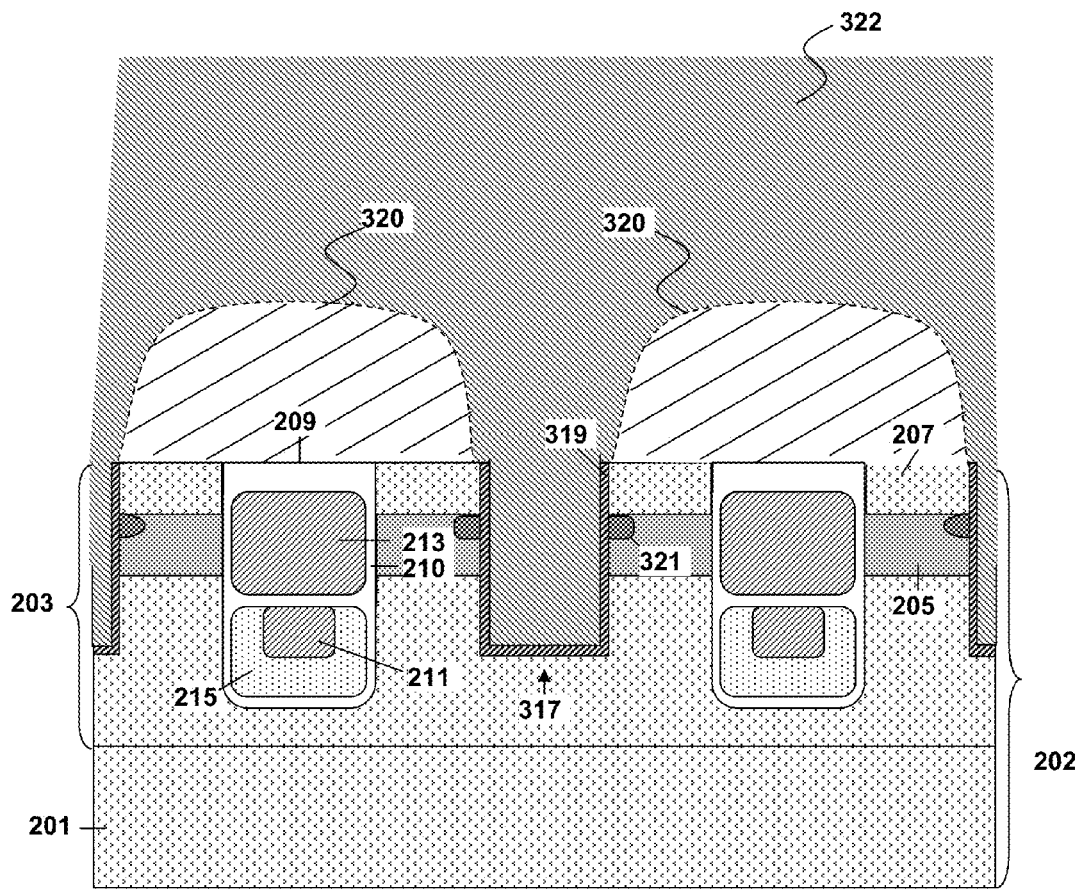
FIG. 3 is a schematic diagram illustrating a silicon-carbide trench power MOSFET integrated structure that includes Schottky diodes in accordance with an alternative embodiment of the present invention.

FIG. 3 illustrates the silicon carbide trench MOSFET integrated structure in FIG. 2 with one or more Schottky diodes integrated therein forming a plurality of power MOSFET devices in accordance with an embodiment of the present invention. When constructing a power MOSFET device (i.e., MOSFET in parallel with diode) using a silicon carbide substrate, a Schottky diode is preferred over a P-N junction diode. This is the result of several non-ideal behavioral characteristics exhibited by the P-N junction diode during device operation.

For a silicon-based power MOSFET device, the forward voltage drop across a P-N junction diode that is currently conducting current is 0.7 V. This forward voltage drop is tolerable for operation of a silicon-based power MOSFET device. Unfortunately, the forward voltage drop across the P-N junction diode increases to 2.3 V when implemented using a silicon carbide-based power MOSFET device. Such a large forward voltage drop is not tolerable for device operation, and as such the P-N junction diode is not preferred when constructing a silicon carbide-based power MOSFET device. Moreover the P-N junction diode injects stored charge when turned on, which leads to the introduction of conduction losses when attempting to remove such charges. As such, a Schottky diode is preferred when constructing a silicon carbide-based power MOSFET device.

The silicon carbide trench power MOSFET integrated structure 300 of FIG. 3 has a similar structure to the silicon carbide trench MOSFET integrated structure in FIG. 2, with the addition of integrated Schottky diodes. A contact trench 317 is formed between two trenches 209. Each contact trench extends into the substrate composition 202, either the epitaxial layer 203 or the substrate 201. The trench 317 can go deeper than the bottom surface of the body region 205 and directly contact the epitaxial layer 203. However, it will have a Schottky barrier due to a work function difference. Schottky barrier metal 319 then lines each contact trench 317.

The Schottky barrier metal 319 may include Titanium/Titanium nitride (Ti/TiN) silicide and may be grown or deposited, RTP on the sidewall and bottom of the trench with a two-step salicide process with excess Ti being removed.

A Schottky junction is formed at the interface between the barrier metal at the bottom of each contact trench 317 and the silicon carbide substrate composition. The Schottky barrier metal 319 forms the anode of the Schottky diode and the substrate composition 202 forms the cathode of the Schottky diode. While the diagram illustrates the Schottky junction being formed at the interface between the bottom of the contact trench 317 and the epitaxial layer 203, it is important to note that the Schottky junction may be formed at the interface between the barrier metal at the bottom of the contact trench 317 and the silicon carbide substrate 201 when no epitaxial layer 203 is present. In such a case, the Schottky junction can be formed at the interface between the metal 317 and a lightly doped portion of the semiconductor material of the substrate 201. Typically, the substrate 201 is heavily doped and the epitaxial layer 203 is lightly doped. An insulator 320, such as borophosphosilicate glass (BPSG) may cover upper surfaces of the gate regions 211, 213 while not covering portions of the source regions 207.

A source metal 322 may make contact to the source regions 207 and the barrier metal 317 through openings in the insulator 320. The source metal 322 may be any suitable metal, such as Nickel, Titanium, or Gold. Such metals may be deposited, e.g., by chemical vapor deposition (CVD) or physical vapor deposition (PVD).

Optional doped shielding regions 321 may be formed in the body region 205 proximate the top of the contact trench. In this case, the doped shielding region may be formed by ion implantation/diffusion before the barrier metal deposited. The doped shielding regions 321 can be configured to reduce the electric field present on the Schottky diode during device operation. A strong electric field leads to excess leakage current during on-state operation of the diode, degrading the functionality of the power MOSFET device. In general, the doped shielding regions 321 are doped with the same conductivity-type dopants as the nearby body region but with a greater concentration of dopants. By way of example, and not by way of limitation, if the body region 205 is doped p-type, the doped shielding region 321 may be a p+ type doped region. The doped shielding regions 321 rectify this problem by shielding the Schottky diode from excessive electric fields. The doped shielding regions 321 also provide the additional benefit of supplying supplemental electric field shielding to the insulating layer 210, further reducing insulating layer field stress for more effective device operation.

The split-gate configuration with a thick insulating portion at the bottom of the trench reduces the electric field at the bottom and corners of the trench and moves the electric field away the Schottky diode, resulting in removal of the storage charge and increasing the breakdown voltage, which improves the performance of the power device.

Although the present invention has been described in considerable detail with reference to certain preferred versions thereof, other versions are possible. Therefore, the spirit and scope of the appended claims should not be limited to the description of the preferred versions contained herein. Instead, the scope of the invention should be determined with reference to the appended claims, along with their full scope of equivalents.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features. Any feature, whether preferred or not, may be combined with any other feature, whether preferred or not. In the claims that follow, the indefinite article "A", or "An" refers to a quantity of one or more of the item following the article, except where expressly stated otherwise. Any element in a claim that does not explicitly state "means for" performing a specified function, is not to be interpreted as a "means" or "step" clause as specified in 35 USC §122, ¶6.

The reader's attention is directed to all papers and documents which are filed concurrently with this specification and which are open to public inspection with this specification, and the contents of any papers and documents incorporated herein by reference.

What is claimed is:

1. An integrated structure that includes a plurality of split-gate trench MOSFETs, comprising:
   a) a silicon carbide substrate composition;
   b) a plurality of trenches formed within the silicon carbide substrate composition, each trench being lined with a passivation layer, each trench being substantially filled with a first conductive region and a second conductive region and an insulating material having a dielectric constant similar to a dielectric constant of the silicon carbide substrate composition, the first conductive region being separated from the passivation layer by only the insulating material, the first and second conductive regions forming gate regions for each trench MOSFET of the integrated structure, and the first conductive region and the second conductive region being separated by the passivation layer;
   c) a doped body region of a first conductivity type formed at an upper portion of the substrate composition; and
   d) a doped source region of a second conductivity type formed in the doped body region proximate each trench, wherein the second conductivity type is opposite the first conductivity type.

2. The integrated structure of claim 1, wherein the silicon carbide composition includes a silicon carbide substrate.

3. The integrated structure of claim 1, wherein the silicon carbide composition includes a silicon carbide substrate with an epitaxial layer formed thereon.

4. The integrated structure of claim 1, wherein the passivation layer is composed of silicon dioxide.

5. The integrated structure of claim 1, wherein the insulating material has a dielectric constant between 50% and 150% of the dielectric constant for the silicon carbide substrate composition.

6. The integrated structure of claim 1, wherein the insulating material is composed of silicon nitride.

7. The integrated structure of claim 1 wherein a portion of the insulating material between the first conductive region and a bottom of the trench is thicker than a portion of the passivation layer that is between the insulating material and the bottom of the trench.

8. The integrated structure of claim 1, further comprising:
   e) one or more contact trenches, each contact trench being formed between two adjacent trenches proximate the source region, the depth of each contact trench extending through the body region into the silicon carbide substrate composition; and
   f) a Schottky barrier metal formed inside each contact trench, the Schottky barrier metal forming a Schottky junction at an interface between the Schottky barrier metal and the silicon carbide substrate composition, the Schottky barrier metal forming an anode of a Schottky diode and the silicon carbide substrate composition forming a cathode of the Schottky diode.

9. The integrated structure of claim 8, further comprising:
   g) two doped shielding regions of the first conductivity type on opposite sides of each contact trench, each doped shielding region being formed within the body region.

10. The integrated structure of claim 9 wherein the doped shielding regions are more heavily doped than the body region.

11. A method for forming an integrated structure that includes a plurality of split-gate trench MOSFETs, comprising:
   a) forming a plurality of trenches within a silicon carbide substrate composition, each trench being lined with a passivation layer, each trench being substantially filled with a first conductive region and a second conductive region and an insulating material having a dielectric constant similar to a dielectric constant of the silicon carbide substrate composition, the first conductive region being separated from the passivation layer by only the insulating material, the first and second conductive regions forming gate regions for each trench MOSFET of the integrated structure, and the first conductive region and the second conductive region being separated by the passivation layer;

c) doping an upper portion of the substrate composition with dopants of a first conductivity type to form a body region; and d) doping a portion of the body region with dopants of a second conductivity type to form a source region in the portion of the body region, wherein the second conductivity type is opposite the first conductivity type.

12. The method of claim 11, wherein the silicon carbide composition includes a silicon carbide substrate.

13. The method of claim 11, wherein the silicon carbide composition includes a silicon carbide substrate with an epitaxial layer formed thereon.

14. The method of claim 11, wherein the passivation layer is composed of silicon dioxide.

15. The method of claim 11, wherein the insulating layer has a dielectric constant between 50% and 150% of the dielectric constant for the silicon carbide substrate composition.

16. The method of claim 11, wherein the insulating layer is composed of silicon nitride.

17. The method of claim 11, further comprising:

e) forming one or more contact trenches, each contact trench being formed between two adjacent trenches proximate the source region, the depth of each contact trench extending through the body region into the silicon carbide substrate composition; and f) forming a Schottky barrier metal inside each contact trench, the Schottky barrier metal forming a Schottky junction at an interface between the Schottky barrier metal and the silicon carbide substrate composition, the Schottky barrier metal forming an anode of a Schottky diode and the silicon carbide substrate composition forming a cathode of the Schottky diode.

18. The method of claim 17, further comprising:

g) forming two doped shielding regions of the first conductivity type on opposite sides of each contact trench, each doped shielding region being formed within the body region.

19. The method of claim 18 wherein the doped shielding regions are more heavily doped than the body region.

* * * * *